United States Patent [19]

Quick

[11] 4,241,264
[45] Dec. 23, 1980

[54] SAMPLED DATA FILTERING AND MULTIPLEXING APPARATUS

[75] Inventor: Marshall K. Quick, Whitesboro, N.Y.

[73] Assignee: General Electric Company, Schenectady, N.Y.

[21] Appl. No.: 40,948

[22] Filed: May 21, 1979

[51] Int. Cl.³ ............... G11C 19/28; H01L 29/78; H01L 29/34
[52] U.S. Cl. ............... 307/221 D; 357/24; 357/54
[58] Field of Search ............... 357/24; 307/221 D

[56] References Cited

U.S. PATENT DOCUMENTS

| | | |
|---|---|---|
| 4,124,861 | 11/1978 | Baertsch et al. ............ 357/24 |
| 4,124,862 | 11/1978 | Engeler et al. ............ 357/24 |
| 4,172,983 | 10/1979 | MacLennan ............ 357/24 |

*Primary Examiner*—Gene M. Munson
*Attorney, Agent, or Firm*—Julius J. Zaskalicky; James C. Davis, Jr.; Marvin Snyder

[57] ABSTRACT

Charge transfer filtering and multiplexing apparatus for sampled data is described which includes a plurality of switched capacitor high pass filters coupled in parallel into the stages of a serial charge transfer shift register.

5 Claims, 8 Drawing Figures

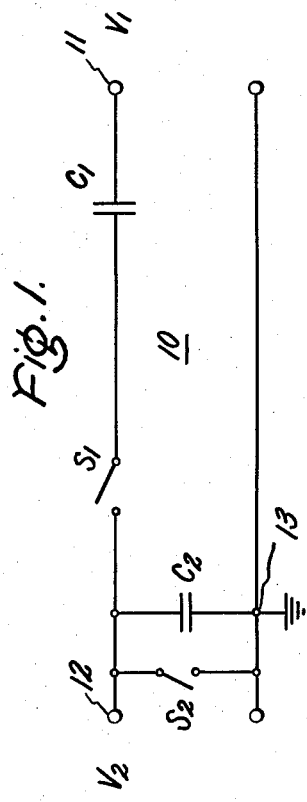
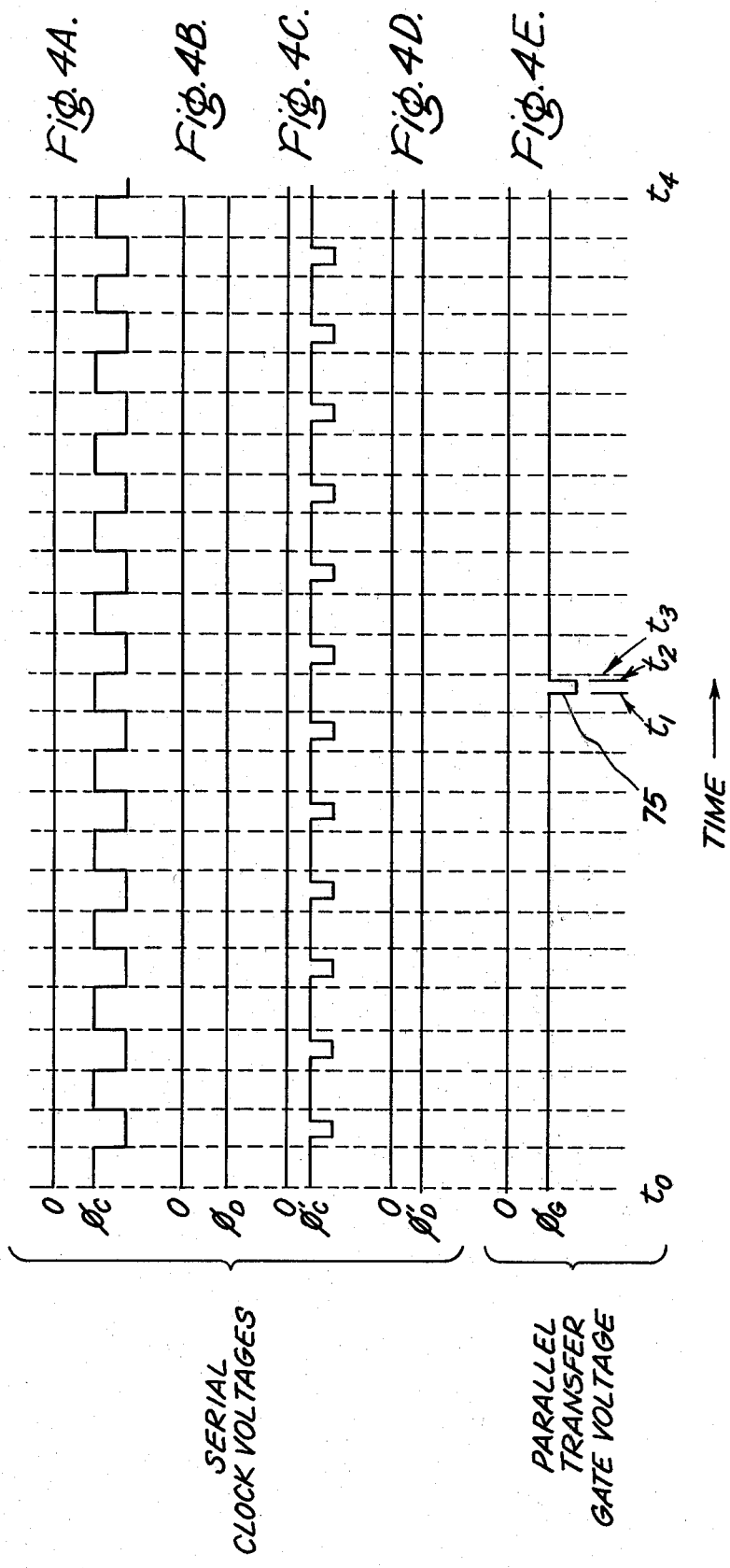

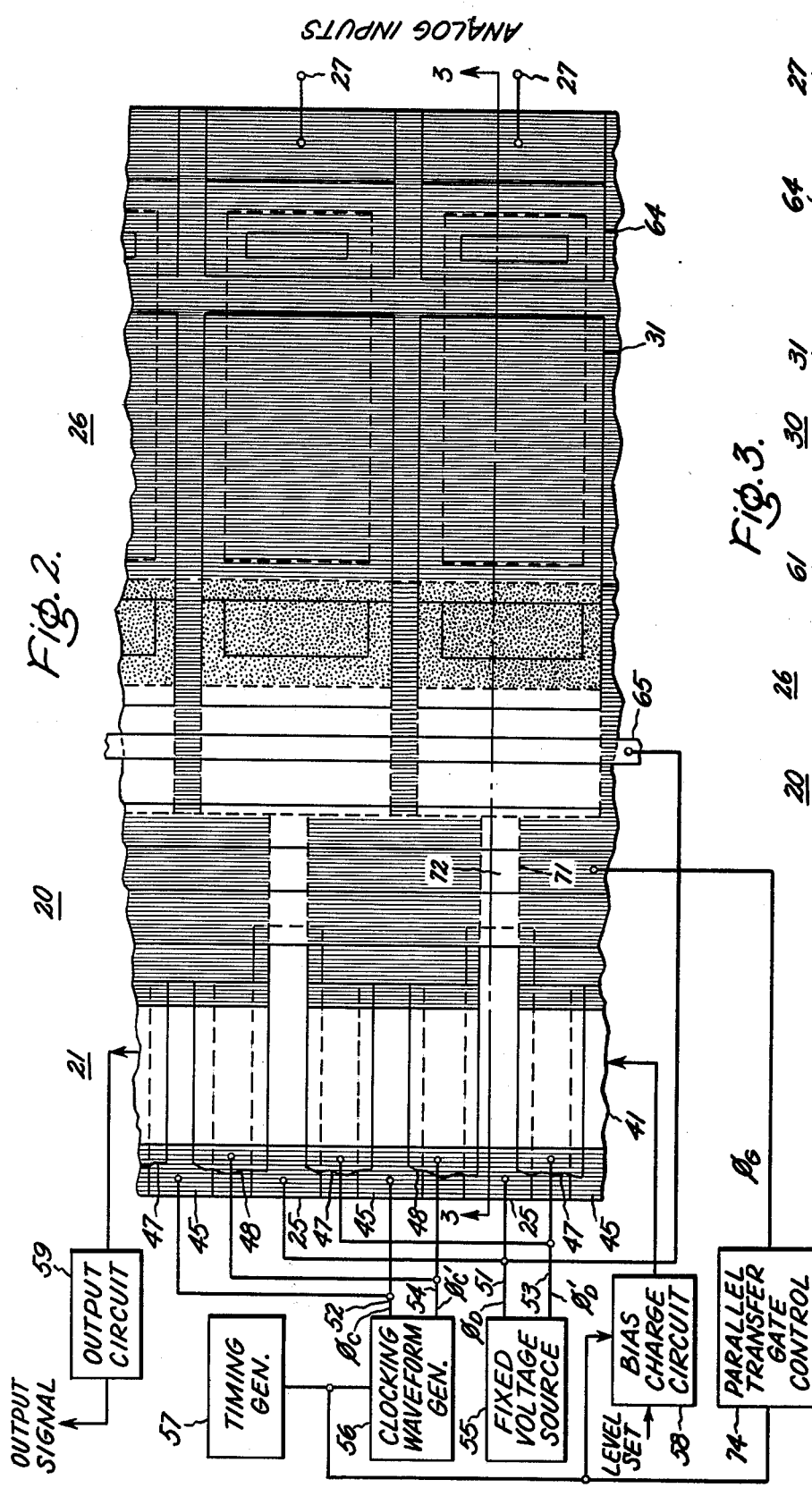

SAMPLED DATA FILTERING AND MULTIPLEXING APPARATUS

The present invention relates in general to switched capacitor sampled data filters which provide a high-pass frequency response, and in particular relates to charge transfer apparatus incorporating a plurality of such switched capacitor high-pass filters for filtering and multiplexing samples of a plurality of signals.

The present invention has particular application in infrared signal processing systems. In such systems an array of detectors are provided for sensing the radiation of a scene to be scanned. The scanning of the scene produces a plurality of signals, one from each of the detectors. Each of the signals is sampled and filtered to remove the DC or background component thereof. Thereafter corresponding samples of each of the signals are multiplexed to provide sequences of sampled signals. These sequences are further processed to provide video signals corresponding to the scene scanned. The present invention is directed to the provision of improvements in apparatus providing these functions.

An object of the present invention is to provide a sampled data filtering and multiplexing apparatus which has high rejection for background or DC components in the signals applied thereto.

Another object of the present invention is to provide a sampled data filtering and multiplexing apparatus which minimizes the generation of pattern noise.

A further object of the present invention is to provide sampled data high-pass filter apparatus for filtering a plurality of signals which has long and accurately controllable time constants.

In carrying out the present invention in one illustrative embodiment thereof there is provided a substrate of semiconductor material of one conductivity type having a major surface. A shift register is provided including a plurality of n stages including a charge input stage and a charge output stage. Each of the stages have a respective storage electrode insulatingly overlying the major surface to provide a respective first storage region adjacent the major surface of the shift register. Clocking means are provided for transferring charge from stage to stage of the shift register. A charge input circuit for generating and transferring charge into the input stage of the shift register and a charge output circuit for sensing charge transferred out of the output stage of the shift register are provided. A plurality of n capacitors are provided, each capacitor including a first electrode and a second electrode. A plurality of n regions of opposite conductivity type adjacent the major surface are provided. Each opposite conductivity type region is situated adjacent a respective first storage region. The first electrode of each of the capacitors is connected to a respective region of opposite conductivity type. A plurality of input terminals are provided, each connected to the second electrode of a respective one of the capacitor. Gating means are provided for establishing a charge transfer channel between each of the first storage regions and a respective region of opposite conductivity type.

The novel features which are believed to be characteristic of the present invention are set forth with particularity in the appended claims. The invention itself, both as to its organization and method of operation, together with further objects and advantages thereof may best be understood by reference to the following description taken in connection with the accompanying drawings wherein:

FIG. 1 shows a schematic diagram of a switched capacitor high-pass filter.

FIG. 2 is a plan view of an embodiment of apparatus in accordance with the present invention.

FIG. 3 is a sectional view of the embodiment of FIG. 2 taken along section lines 3—3 thereof.

FIGS. 4A through 4E show diagrams of voltage waveforms useful in explaining the operation of the apparatus of the present invention.

Reference is now made to FIG. 1 which shows a conventional switched capacitor high pass filter. This circuit comprises two capacitors $C_1$ and $C_2$ and two switches $S_1$ and $S_2$. The capacitor $C_1$, switch $S_1$ and capacitor $C_2$ are connected in series in the order named between an input terminal 11 and ground terminal 13. Switch $S_2$ is connected across capacitor $C_2$. An output terminal 12 is connected to the ungrounded electrode of capacitor $C_2$. The switches $S_1$ and $S_2$ are operated synchronously but in a manner such that both switches are not closed at the same time. An input signal $V_1$ to be filtered is applied between terminal 11 and ground. A filtered output signal is obtained between output terminal 12 and ground.

In operation, the capacitor $C_2$ is precharged to a zero level by closing switch $S_2$. On the next part of the cycle, switch $S_1$ is closed and couples the input signal $V_1$ through $C_1$ to the output terminal 12 where it appears as $V_2$. The charge $q_1$ stored on $C_1$ prior to closing $S_1$ is determined by the values of $V_1$ and $V_2$ at the end of the last $[(i-1)^{th}]$ switching cycle, and is given by the equation:

$$q_1(i-1) = [V_2(i-1) - V_1(i-1)]C_1 \quad (1)$$

The new charge on $C_1$ becomes $[V_2(i) - V_1(i)]C_1$ and the charge on $C_2$ becomes $V_2(i)C_2$. Since the action of closing switch $S_1$ can only redistribute charge, the total charge before and after switch $S_1$ is closed must be equal, i.e.

$$[V_2(i-1) - V_1(i-1)]C_1 = [V_2(i) - V_1(i)]C_1 + V_2(i)C_2, \quad (2)$$
$$\text{or } V_1(i) - V_1(i-1) = V_2(i)[1 + \frac{C_2}{C_1}] - V_2(i-1).$$

Taking the z-transform of equation 2 and solving for the transfer function yields:

$$H(z) = V_2(z)/V_1(z) = a\frac{z-1}{z-a}, \quad (3)$$

where $$a = \frac{C_1}{C_1 + C_2}$$

It is evident from equation (3) the filter has a high pass characteristic as there is a zero at $z=1$ and a pole at $$z = \frac{C_1}{C_1 + C_2}.$$

The frequency response of the filter is obtained by the substitution of $e^{+j\omega T}$ for z in equation 3:

$$|H(j\omega)| = a\sqrt{\frac{2(1-\cos\omega T)}{1-2a\cos\omega T + a^2}}, \quad (4)$$

where $\omega$ represents the frequency of the input signal and T is the period of the switching cycle.

The frequency response at $\omega=0$ is 0 and at the Nyquist rate, $\omega=\pi/T$, the response is given by the following:

$$|H(j\omega)| = \frac{2a}{1+a} = \frac{2C_1}{2C_1+C_2}.$$

Reference is now made to FIGS. 2 and 3 which show apparatus 20 in accordance with the present invention in which a plurality of switched capacitor high pass filters such as shown in FIG. 1 are provided and in which the outputs thereof are multiplexed. The apparatus includes a charge transfer shift register 21 having a plurality of n stages. The shift register 21 is formed on a substrate 22 of semiconductor material of one conductivity type having a major surface 23. Each of the stages of the shift register includes a respective first storage region 24 adjacent the major surface 23 and a first storage electrode 25 insulatingly overlying the first storage region. The apparatus 20 also includes a plurality of switched capacitor high-pass filters 26, such as shown in FIG. 1, only two of which are shown completely. Each of the filters 26 includes an input terminal 27, a first capacitor 30, a second capacitor 25a and a gating stage 28 corresponding to input terminal 11, capacitor $C_1$, capacitor $C_2$, and switch $S_1$, respectively, of FIG. 1. The first capacitor 30 includes a first electrode 31 connected to a region 32 of opposite conductivity type, situated adjacent a respective first storage region 24 of the shift register and a second electrode 33 connected to the input terminal 27. The second capacitor 25a comprises the capacitance of the first storage electrode 25 with respect to the substrate 22 and the depletion capacitance of the storage region 24. An auxiliary electrode 29 is provided insulatingly overlying the surface adjacent region of the substrate contiguous the region 32 of opposite conductivity type. The electrode 29 is connected to the potential of the electrode 25 and establishes an inversion layer as conduction channel in the surface adjacent region of the substrate lying thereunder. The gating stage 28 comprises a gating electrode 34 insulatingly overlying the surface adjacent region of the substrate 22 between the first storage region 24 and the surface adjacent region underlying the auxiliary electrode 29 for controlling conduction between the first electrode 31 of the first capacitor and the first storage region 24 underlying electrode 25 of the second capacitor. The provision of such an electrode facilitates the fabrication of the apparatus and, if desired, may be eliminated. In such case the region 32 of opposite conductivity type would be contiguous with the surface adjacent region underlying the gating electrode 34.

A plurality of n analog signals are provided, each of which is applied to a respective input terminal 27. During a first period of time packets of charge, each including a fixed quantity of charge, are clocked into the shift register with each packet stored in a respective first storage region 24 thereof. During a second period of time the gating stages 28 of each of the filters 26 is activated and the charge stored in the first storage regions of the shift register is equilibrated with the potential on the first electrode of the first capacitor thereby modifying the packet of charge stored therein in accordance with the signal applied to the input terminal. During a third period of time the gating stages of each of the filters is closed thereby containing in each of the stages of the shift register respective packets of charge modified by the signal applied to respective input terminals of the filters. During the third period of time, after the gating stages of each of the filters has been closed, the modified packets of charge are clocked out of the shift register into an output circuit in which the packets of charge are converted into signal samples. Thus, a first sequence of multiplexed signal samples is obtained, one sample from each of the respective analog signal samples. During the time that the modified packets of charge are being clocked out, a succeeding sequence of packets of fixed charge are being clocked in as part of a cycle of operation. These packets are modified in accordance with the analog signal samples and are in turn clocked out to the output circuit where they are converted into signal samples. Corresponding samples of the successive sequences correspond to successive samples of an analog input signal. Thus, the rate at which an input signal is sampled is equal to the rate at which the gating switch is operated. The number of signal samples n in a sequence is equal to the number of stages n in the shift register and also is equal to the number of filters n provided in the apparatus.

The substrate 22 may be constituted of silicon semiconductor material of N-type conductivity and of suitable resistivity, for example, 4 ohm centimeters. The substrate is provided with a channel portion 41 over which the shift register 21 is formed. Overlying major surface 23 of the substrate 22 is a thick insulating member 42 of silicon dioxide having a thin portion 43 therein lying in registry with the channel portion 41. In FIG. 2 the thick portions of the insulator 42 are indicated by shading. A plurality of first storage electrodes 25 are provided on the insulating member 42 overlying the thin portion 43. Each of the first storage electrodes is of uniform length in the direction of the length dimension of the channel portion 41, i.e. in the direction of charge transfer. Each of the first storage electrodes extends across both the thin insulating portion 43 and the bordering thick insulating portions of the insulating member 42. A plurality of second storage electrodes 45 is provided on the insulating member 42 overlying the thin portion 43. Each of the electrodes 45 is of uniform length in the direction of the length dimension of the channel portion 41 and equal to the uniform length of the first storage electrodes 25. Each of the electrodes 45 extends across both the thin insulating portion 43 and the bordering thick insulating portions of insulating member 42. An insulating layer 46 is provided over the electrodes 25 and 45. A plurality of first transfer electrodes 47 are provided over the insulating layer 46. Each of the first transfer electrodes 47 is insulatingly spaced between a respective second storage electrode 45 and an adjacent succeeding first storage electrode 25 and overlying these electrodes. A plurality of second transfer electrodes 48 are provided over the insulating layers 46. Each of the second transfer electrodes 48 is insulatingly spaced between a respective first storage electrode 25 and an adjacent succeeding second storage electrode 45 and overlying these electrodes. Each of the transfer electrodes 47 and 48 is of substantially uniform extent in the direction of the length of the channel portion 41 and extends over the thin insulating portion 41 of the insulating member 42 as well as the bordering thick insulating portions thereof.

All of the first storage electrodes 25 of the shift register 21 are connected to a line 51 to which a $\phi_D$ voltage is supplied from a fixed voltage source 55. All of the second storage electrodes 45 of the shift register 21 are connected to line 52 to which a $\phi_C$ voltage is supplied from a clocking waveform generator 56. The clocking waveform generator 56 is under the control of the timing generator 57. All of the first transfer electrodes 47 of the shift register 21 are connected to a $\phi_D'$ line 53 to which a $\phi_D'$ voltage is supplied from fixed voltage source 55. All of the second transfer electrodes 48 of the shift register 21 are connected to a $\phi_C'$ line 54 to which a $\phi_C'$ voltage is applied from a clocking waveform generator 56. The $\phi_C$, $\phi_D$, $\phi_C'$ and the $\phi_D'$ voltage waveforms are shown in FIGS. 4A through 4D, respectively.

The filter stages 26 are formed on the semiconductor substrate 22. A plurality of second electrodes 33 of first capacitors 30 is provided, each overlying a portion of thick insulator 42. A thin insulating layer 61 is provided over electrodes 33. A plurality of first electrodes 31 of capacitors 30 is provided, each overlying thin insulating layer 61. A plurality of third or auxiliary electrodes 29 is provided, each overlying thin insulating layer 62 which in turn overlies a respective surface adjacent portion 29a of the substrate and forming a third capacitor therewith. A plurality of regions 32 of opposite conductivity type indicated by stiple shading in FIG. 2 is provided in the substrate adjacent the major surface 23 thereof, each contiguous with a respective surface adjacent portion 29a. Each region 32 of opposite conductivity type is connected to a respective first electrode 31 by a respective conductor 63. A plurality conductive connections 64 are provided, each between a respective second electrode 33 of capacitor 30 and a respective input terminal 27. A conductive connection 65 is provided to all of the third electrodes 29 which is connected to the $\phi_D$ line 51 of the fixed voltage source 55. Thus, with the application of the indicated potential to a third electrode 29 a third capacitance is provided between the third electrode and the substrate. The $\phi_D$ electrodes 25 of the shift register 21 form second capacitors with the surface adjacent regions of the substrate lying thereunder.

A plurality of thin recesses 71 are provided in the thick insulating member 42 underlying which are thin insulating portions 72, each connecting a respective part of the thin insulating portion 43 with a respective part of the thin insulation portion 62. The first or $\phi_D$ electrodes 25 of the shift register 21 extend into the recesses 71 and each overlie a first part of a respective thin insulating portion 72. A parallel transfer gate or line 34 is provided on the insulating portion 42 between the thin insulating portions 43 and 62 overlying the recesses 71 between the $\phi_D$ electrodes 25 and the third electrodes 29. The parallel transfer gate 34 is connected to a parallel transfer gate control 74 which provides a parallel transfer gate voltage $\phi_G$, as shown in FIG. 4E. The parallel transfer gate control 74 is synchronized with the timing generator 57. When a suitable gate potential is applied to the gate electrode 34 a conductive channel is formed in the underlying surface adjacent region of the substrate 22 which enables transfer of charge from the storage regions 24 underlying the $\phi_D$ electrodes of the shift register 21 to the first storage regions 29a underlying the third electrodes 29 of the filter stages and to the first electrode 31 of first capacitor 30.

Each stage of the shift register 21 includes a $\phi_D$ storage region underlying a $\phi_D$ electrode 25 and a $\phi_C$ storage region underlying a $\phi_C$ electrode 45. The $\phi_D$ voltage applied to the $\phi_D$ electrode is fixed. The $\phi_C$ voltage applied to the $\phi_C$ electrode cycles between a high level and a low level above and below the $\phi_D$ voltage. When the $\phi_C$ voltage is at its high level, charge transfer is enabled from the $\phi_C$ storage region to the $\phi_D$ storage region and conversely when the $\phi_D$ voltage is at its low level, charge transferred from the $\phi_D$ storage region to the $\phi_C$ storage region is enabled. Each stage also includes a $\phi_D'$ electrode 47 to which is applied a $\phi_D'$ voltage of fixed value which produces a surface potential in the substrate underlying the electrode which is smaller in absolute magnitude than the surface potential underlying a $\phi_D$ electrode. Each stage also includes a $\phi_C'$ electrode 48 to which is applied a $\phi_C'$ voltage having two levels. At the upper level a surface potential is produced in the substrate underlying the electrode which inhibits the transfer of charge from a $\phi_D$ storage region to a $\phi_C$ storage region. At the lower level a surface potential is produced enabling the transfer charge from a $\phi_D$ storage region to a $\phi_C$ storage region.

Packets of charge of fixed value for insertion into the shift register 21 are generated by a bias charge input circuit 58 under the control of the clocking waveform generator 56 and in response to bias charge level setting controls. One input circuit for developing sequence of packets of charge and for inserting the packets into a charge transfer shift register is described in connection with FIGS. 2 and 3 of patent application Ser. No. 787,915, filed Apr. 15, 1977, now U.S. Pat. No. 4,126,852, assigned to the assignee of the present invention, and incorporated herein by reference thereto.

After charge packets have been clocked into the shift register 21 and have been equilibrated and hence modified by the various filter stages 26 of the apparatus in a manner to be explained below, the resultant packets of charge are contained in the storage regions underlying the $\phi_D$ electrodes 25. The resultant packets of charge are then clocked out of the shift register and sensed in an output circuit 59 from which an output signal is obtained. One output circuit suitable for providing an output in accordance with the sequence of packets of charge clocked thereinto is described in connection with FIG. 1 of patent application Ser. No. 825,924, filed Aug. 19, 1977, now U.S. Pat. No. 4,125,786, assigned to the assignee of the present invention, and incorporated herein by reference thereto.

The operation of the apparatus of FIGS. 2 and 3 will now be explained in connection with the waveform diagrams of FIGS. 4A through 4E. A plurality of analog signals are provided, each being applied to a respective input terminal 27. During a first period of time $t_0$–$t_1$, a first sequence of charge packets of fixed value are generated and clocked into the shift register 21. During a second period of time, $t_1$–$t_2$, after charge has been transferred into the $\phi_D$ storage regions, a gating pulse 75 (FIG. 4E) is provided to the parallel transfer gate 34 enabling the charge underlying each of the $\phi_D$ electrodes to flow into surface adjacent portions of the substrate underlying a respective third electrode 29 and equilibrate therewith as well as with the potential on the respective first electrode 31 of the first capacitor 30. During this period the fixed packets of charge are modified as explained in connection with FIG. 1. Upon termination of the pulse 75 at time $t_2$ the modified packets of charge are contained in the storage regions underlying the $\phi_D$ electrodes of the shift register 11. During a third period of time, $t_3-T_4$, subsequent to time $t_2$, the modified packets of charge stored in the storage regions underlying the $\phi_D$ electrodes are clocked out into the output circuit 59 where they are sensed and an output signal is developed therefrom. During the third period of time while packets of charge are being clocked out of the shift register, a second sequence of packets of fixed value are clocked into the shift register for processing in the same manner as the first sequence of packets. Thus, successive sequences of packets of fixed value are processed and read out. The sequences of multiplexed samples may be utilized directly to provide a display. Also, corresponding output samples of successive sequences may be demultiplexed, if desired, to provide a plurality of sequences of output samples, each corresponding to a respective one of the analog signals. The time period, $t_1-t_2$, occurs during the portion of the time $\phi_C$ clock cycle when $\phi_C$ voltage is high without any interruption in the clocking of charge in the shift register 11.

The function of the second switch $S_2$ of FIG. 1 is implemented in the apparatus of FIG. 2 by the dynamic operation of the shift register 21. The transfer of a fixed packet of charge into a storage region corresponds to a closing and opening of the switch $S_2$ and the actuation of the transfer channel to that storage region by gating voltage applied to the gating electrode 34 corresponds to a closing and opening of switch $S_1$.

The high-pass multiplexed charge transfer apparatus described offers several advantages. A primary advantage is that the zero in the transfer function of each of the filter stages 26 is inherent in the capacitive coupling provided by the first capacitors to the first storage regions of the shift register. Thus, the DC rejection is limited only by the signal dependent leakage currents appearing across the input capacitors 30. The second advantage is that low pattern noise is achieved in this apparatus. The principle source of pattern noise in this apparatus is the non-uniformity in leakage current to the first electrode 31 of capacitor 30. When the apparatus is operated at cryogenic temperatures, this leakage becomes extremely small. The third advantage of the apparatus is that the frequency response of the filter sections is determined only by the clock frequency and by the ratio of the first capacitance 30 and the second capacitance 25a of the stages of the shift registers. Since the ratio of these capacitances is determined by the ratio of two areas, the frequency response may be accurately predicted and controlled.

While in the apparatus described in connection with FIGS. 2 and 3, third storage electrodes 29 were provided in the gating stages of each of the filter stages in order to facilitate fabrication and to enable each filter stage to be designed with precision particularly with respect to the location of the regions of opposite conductivity type with respect to the gating electrode 34. Such third electrodes 29 could be eliminated, if desired, and each of the regions 32 of opposite conductivity type of each of the filter stages made contiguous with the surface adjacent region underlying each of the gate electrode 34. In the design shown the third electrodes provide in effect a small third capacitance connected between the first electrode of the first capacitor 30 and the ground or reference terminal of the filter. The third capacitance adds a small capacitance to the capacitance 30 and increases the time constant of the filter stage 26 while decreasing the gain thereof.

While the invention has been described in connection with the apparatus constituted of N-type conductivity substrates, P-type conductivity substrates could as well be used. Of course, in such case the applied potentials would be reversed in polarity.

While the invention has been described in a specific embodiment, it will be understood that modifications, such as those described above, may be made by those skilled in the art, and it is intended by the appended claims to cover all such modifications and changes as fall within the true spirit and scope of the invention.

What I claim as new and desire to secure by Letters Patent of the United States is:

1. In combination
    a substrate of semiconductor material of one conductivity type having a major surface,
    a charge transfer shift register including a plurality of n stages including a charge input stage and a charge output stage, each of said stages having a respective storage electrode insulatingly overlying said major surface to provide a respective first charge storage region adjacent said major surface,
    clocking means for transferring charge from stage to stage of said shift register,
    a charge input circuit for generating and transferring charge into said input stage and a charge output circuit for sensing charge transferred out of said output stage,
    a plurality of n capacitors, each capacitor including a first electrode and a second electrode,
    a plurality of n regions of opposite conductivity type adjacent said major surface, each situated adjacent a respective first storage region, the first electrode of each capacitor connected to a respective region of opposite conductivity type,
    a plurality of n signal input terminals, each connected to the second electrode of a respective one of said capacitors,
    gating means for establishing a charge transfer channel between each of said first storage regions and a respective region of opposite conductivity type,
    means for providing a plurality of n analog signals, each to a respective one of said input terminals,
    means controlling said input circuit for developing in succession sequences of fixed quantities of charge each sequence having the same number n of fixed quantities of charge, the fixed quantities of charge of each sequence being serially transferred in succession into the n stages of said shift register,
    means for actuating said gating means after the n fixed quantities of charge of each sequence are stored in the n first storage regions of said shift register for an interval less than the interval of storage of charge therein whereby a plurality of second sequences of charges are produced, each of the charges of a second sequence being formed by alteration of a fixed quantity of charge in a respective first storage region in response to a respective analog signal being applied thereto through a respective capacitor,
        said charge output circuit sensing in succession the charges of each of said second sequence of charges.

2. The combination of claim 1 in which the rate of transferring charge from stage to stage of said shift register is n times the rate of actuation of said gating means.

3. The combination of claim 1 in which said plurality of n capacitors are situated on said substrate.

4. The combination of claim 1 in which the capacitance of each of said capacitors is substantially greater than the capacitance of a respective storage electrode with respect to said substrate.

5. The combination of claim 1 in which a plurality of auxiliary electrodes are provided, each insulatingly overlying a respective surface adjacent conduction channel region of said substrate, each of said conduction channel regions being contiguous to a respective charge transfer channel established by said gating means and a respective region of opposite conductivity type, and in which means are provided for establishing conduction in each of said conduction channel regions.

* * * * *